(12) United States Patent
Tanaka et al.

(10) Patent No.: US 12,161,029 B2
(45) Date of Patent: Dec. 3, 2024

(54) DISPLAY DEVICE

(71) Applicant: SHARP KABUSHIKI KAISHA, Sakai (JP)

(72) Inventors: Tetsunori Tanaka, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 911 days.

(21) Appl. No.: 17/279,588

(22) PCT Filed: Sep. 28, 2018

(86) PCT No.: PCT/JP2018/036555
§ 371 (c)(1),
(2) Date: Mar. 25, 2021

(87) PCT Pub. No.: WO2020/066011
PCT Pub. Date: Apr. 2, 2020

(65) Prior Publication Data
US 2021/0343823 A1 Nov. 4, 2021

(51) Int. Cl.
*H10K 59/131* (2023.01)
*G09G 3/32* (2016.01)

(52) U.S. Cl.
CPC ............. *H10K 59/131* (2023.02); *G09G 3/32* (2013.01); *G09G 2300/0426* (2013.01); *G09G 2354/00* (2013.01)

(58) Field of Classification Search
CPC .................. H10K 59/131; G09G 3/32; G09G 2300/0426; G09G 2354/00; G09G 3/36; G09G 3/3208; G09F 9/30
See application file for complete search history.

(56) References Cited

U.S. PATENT DOCUMENTS

2004/0263670 A1 12/2004 Yamasaki
2017/0294502 A1* 10/2017 Ka ...................... H10K 59/131
2019/0214595 A1* 7/2019 Park ...................... G06F 3/0443

FOREIGN PATENT DOCUMENTS

JP 2005010407 A 1/2005

* cited by examiner

*Primary Examiner* — Matthew A Eason
*Assistant Examiner* — Chayce R Bibbee
(74) *Attorney, Agent, or Firm* — ScienBiziP, P.C.

(57) ABSTRACT

In a display device, a through-hole and a surrounding region surrounding the through-hole are provided inside an edge of a display region, in which there are provided a first bypass wiring line formed in a first metal layer and bypassing the through-hole in the surrounding region, a first divided wiring line formed in the first metal layer and divided onto one side and the other side of the through-hole, a second bypass wiring line formed in a second metal layer and bypassing the through-hole in the surrounding region, and a second divided wiring line formed in the second metal layer and divided onto one side and the other side of the through-hole.

17 Claims, 9 Drawing Sheets

DISPLAY DEVICE

TECHNICAL FIELD

The disclosure relates to a display device.

BACKGROUND ART

PTL 1 discloses a display panel in which an imaging hole is formed in a display region.

CITATION LIST

Patent Literature

PTL 1: JP 2005-010407 A

SUMMARY OF INVENTION

Technical Problem

In the technique disclosed in PTL 1, in a case where a large through-hole is provided in the display region, luminance unevenness due to coupling between signal lines is eliminated.

Solution to Problem

A display device according to an aspect of the disclosure is a display device including: a substrate; a first metal layer, a first inorganic insulating film, and a second metal layer in this order on the substrate; a display region provided with a plurality of scanning signal lines and a plurality of light emission control lines included in the first metal layer, the plurality of light emission control lines extending parallel to the plurality of scanning signal lines, and provided with a plurality of data signal lines and a plurality of upper layer power source lines crossing the plurality of scanning signal lines and included in the second metal layer; a through-hole and a surrounding region surrounding the through-hole inside an edge of the display region; at least one of configurations, in one of the configurations, the first metal layer includes a first bypass wiring line bypassing the through-hole in the surrounding region and a first divided wiring line divided onto one side and the other side of the through-hole, and in the other of the configurations, the second metal layer includes a second bypass wiring line bypassing the through-hole in the surrounding region and a second divided wiring line divided onto one side and the other side of the through-hole.

Advantageous Effects of Disclosure

According to an aspect of the disclosure, even in a case where a large through-hole is provided in the display region, luminance unevenness due to coupling between signal lines can be eliminated.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
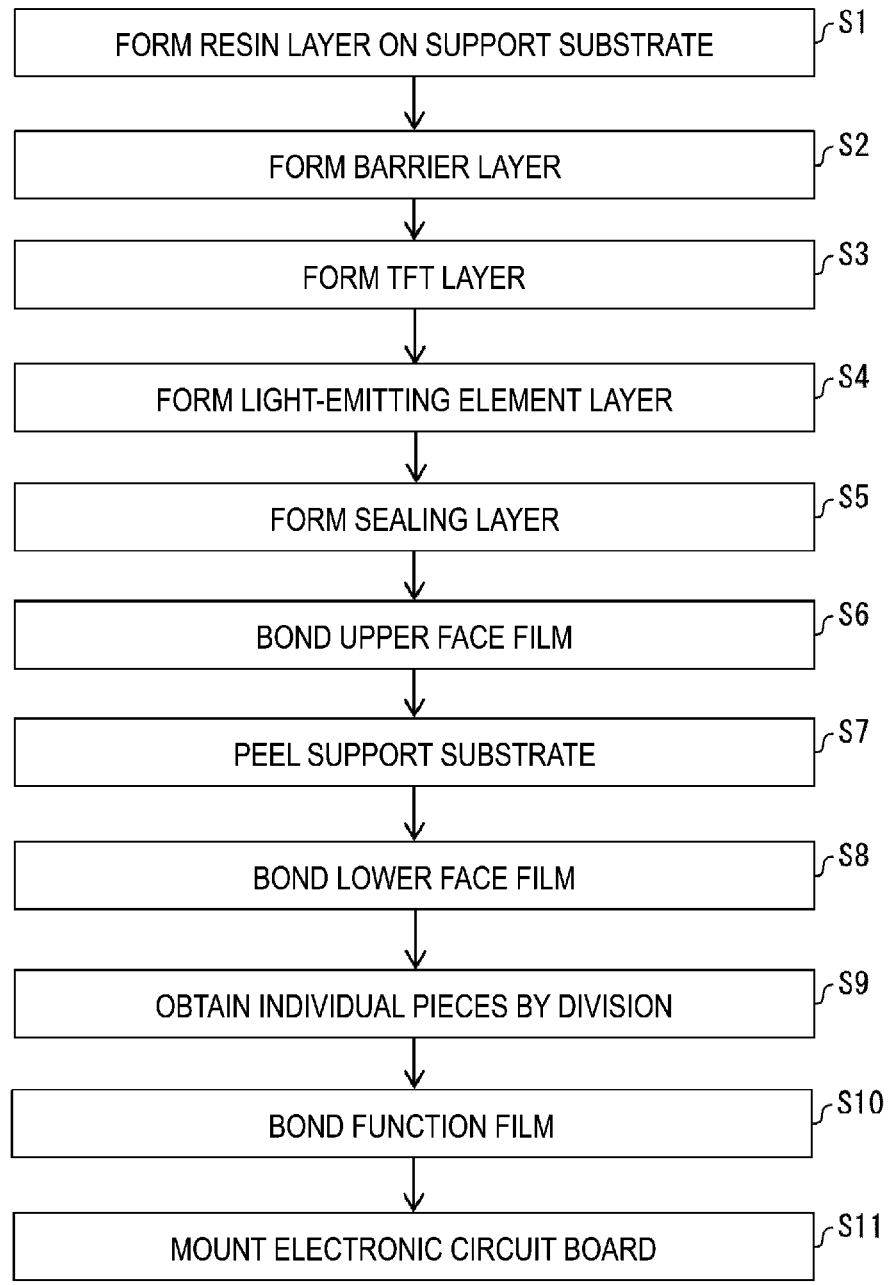
FIG. 1 is a flowchart illustrating an example of a manufacturing method of a display device.
Figure 2:
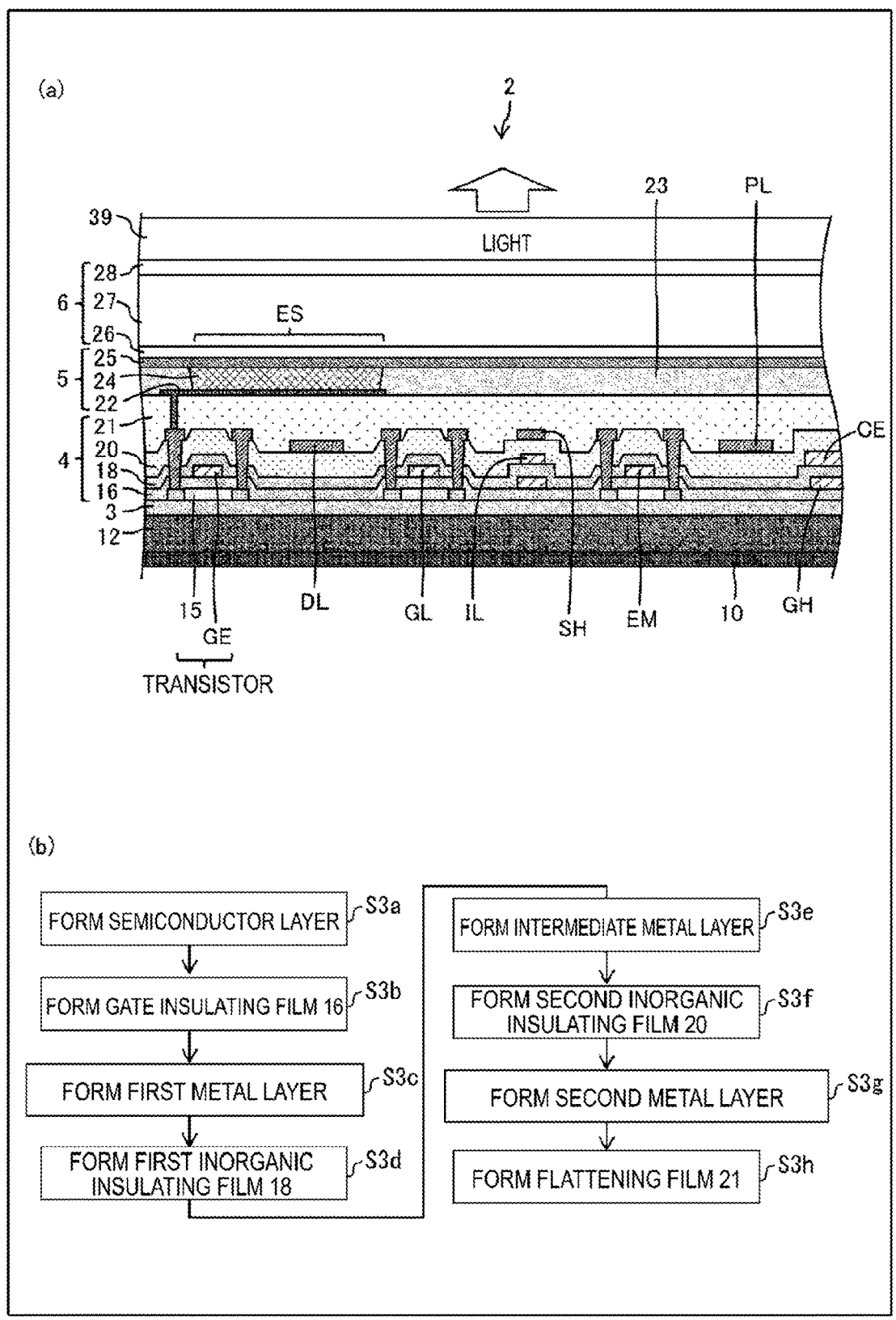
FIG. 2(a) is a cross-sectional view illustrating a configuration example of a display region of a display device.
FIG. 2(b) is a flowchart illustrating a process for forming a TFT layer in FIG. 2(a).

FIG. 1 is a flowchart illustrating an example of a manufacturing method of a display device. FIG. 2 is a cross-sectional view illustrating a configuration example of a display portion of the display device.

In a case where a flexible display device is manufactured, as illustrated in FIG. 1 and FIG. 2, first, a resin layer 12 is formed on a transparent support substrate (a mother glass, for example) (step S1). Next, a barrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 due to irradiation with a laser light or the like (step S7). Next, a lower face film 10 is bonded to the lower face of the resin layer 12 (step S8). Next, the layered body including the lower face film 10, the resin layer 12, the barrier layer 3, the TFT layer 4, the light-emitting element layer 5, and the sealing layer 6 is divided to obtain a plurality of individual pieces (step S9). Next, a function film 39 is bonded on the obtained individual pieces (step S10). Next, an electronic circuit board (for example, an IC chip or an FPC) is mounted on a portion (terminal portion) of the display region located further outward (a non-display region or a frame) than a portion where a plurality of subpixels are formed (step S11). Note that steps S1 to S11 are executed by a display device manufacturing apparatus (including a film formation apparatus that executes the process from step S1 to S5).

Examples of the material of the resin layer 12 include a polyimide and the like. A portion of the resin layer 12 can be replaced by a resin film with double layers (for example, polyimide films) with an inorganic insulating film sandwiched therebetween as illustrated in FIG. 2(b).

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD).

The TFT layer 4 includes a semiconductor film 15, a gate insulating film 16 in an upper layer than the semiconductor film 15, a gate electrode GE and a gate wiring line GH in an upper layer than the gate insulating film 16, a first inorganic insulating film 18 in an upper layer than the gate electrode GE and the gate wiring line GH, a capacitance electrode CE in an upper layer than the first inorganic insulating film 18, a second inorganic insulating film 20 in an upper layer than the capacitance electrode CE, a source wiring line SH in an upper layer than the second inorganic insulating film 20, and a flattening film 21 in an upper layer than the source wiring line SH.

The semiconductor film 15 is constituted of, for example, a low-temperature polysilicon (LTPS) or an oxide semiconductor (for example, an In—Ga—Zn—O based semiconductor), and a transistor (TFT) is configured to include the semiconductor film 15 and the gate electrode GE. FIG. 2 illustrates the transistor that has a top gate structure, but the transistor may have a bottom gate structure.

The gate electrode GE, the gate wiring line GH, the capacitance electrode CE, and the source wiring line SH are each composed of a single layer film or a layered film of a metal, for example, including at least one of aluminum, tungsten, molybdenum, tantalum, chromium, titanium, and copper, for example.

As illustrated in FIG. 2, the TFT layer 4 includes a first metal layer formed in step 3c, an intermediate metal layer formed in step 3e, and a second metal layer formed in step 3g, where the gate electrode GE, a scanning signal line GL, and a light emission control line EM are included in the first metal layer, the source wiring line SH, a data signal line DL, and an upper layer power source line PL (ELVDD line) are included in the second metal layer, and the capacitance electrode CE, an initialization power source line IL, and a lower layer power source line QL (not illustrated) are included in the intermediate metal layer. Note that, for example, the gate electrode GE, the scanning signal line GL, and the light emission control line EM being included in the first metal layer means that the gate electrode GE, the scanning signal line GL, and the light emission control line EM are formed in the same layer with the same material as the first metal layer.

The gate insulating film 16, the first inorganic insulating film 18, and the second inorganic insulating film 20 can be formed of, for example, a silicon oxide (SiOx) film or a silicon nitride (SiNx) film, or a layered film of these, formed using CVD. The flattening film 21 can be formed of, for example, a coatable organic material such as polyimide or acrylic.

The light-emitting element layer 5 includes an anode 22 in an upper layer overlying the flattening film 21, an edge cover 23 having insulating properties and covering an edge of the anode 22, an electroluminescent (EL) layer 24 in an upper layer overlying the edge cover 23, and a cathode 25 in an upper layer overlying the EL layer 24. The edge cover 23 is formed by applying an organic material such as a polyimide or an acrylic and then patterning the organic material by photolithography, for example.

A light-emitting element ES (for example, an organic light emitting diode (OLED), a quantum dot light emitting diode (QLED)) including the anode 22, the EL layer 24, and the cathode 25 in island shapes is formed for each subpixel in the light-emitting element layer 5. A control circuit of the light-emitting element ES is formed in the TFT layer 4, and the light-emitting element and the control circuit constitute a subpixel circuit.

For example, the EL layers 24 are formed by layering a hole injection layer, a hole transport layer, a light-emitting layer, an electron transport layer, and an electron injection layer in this order, from the lower layer side. The light-emitting layer is formed into an island shape at an opening of the edge cover 23 (on a subpixel-by-subpixel basis) by vapor deposition or an ink-jet method. Other layers are formed in an island shape or a solid-like shape (common layer). A configuration is also possible in which one or more layers are not formed among the hole injection layer, the hole transport layer, the electron transport layer, and the electron injection layer.

When the light-emitting layer of the OLED is formed by vapor deposition, a fine metal mask (FMM) is used. The FMM is a sheet with a large number of openings (for example, made of Invar material), and an island-shaped light-emitting layer (corresponding to one subpixel) is formed of an organic material passing through one of the openings.

With the light-emitting layer of the QLED, for example, an island-shaped light-emitting layer (corresponding to one subpixel) can be formed by ink-jet application a solvent having quantum dots diffused therein.

The anode (anode electrode) 22 is formed by a layering of indium tin oxide (ITO) and silver (Ag) or an alloy containing Ag, for example, and has light reflectivity. The cathodes (cathode electrode) 25 can be constituted by a transparent conductive material such as a MgAg alloy (extremely thin film), ITO, or IZO (indium zinc oxide).

In a case where the light-emitting element ES is an OLED, positive holes and electrons recombine inside the light-emitting layer in response to a drive current between the anode 22 and the cathode 25, and light is emitted when the excitons generated in this manner transition to a ground state. Because the cathode 25 is transparent and the anode 22 has light reflectivity, the light emitted from the EL layer 24 travels upward and becomes top-emitting.

In a case where the light-emitting element ES is a QLED, positive holes and electrons recombine inside the light-emitting layer in response to a drive current between the anode 22 and the cathode 25, and light (fluorescence) is emitted when the excitons generated in this manner transition from the conduction band of the quantum dot to the valence band.

A light-emitting element (such as an inorganic light-emitting diode) other than an OLED or QLED may be formed in the light-emitting element layer 5.

The sealing layer 6 is transparent, and includes an inorganic sealing film 26 for covering the cathode 25, an organic buffer film 27 formed as an upper layer overlying the inorganic sealing film 26, and an inorganic sealing film 28 formed as an upper layer overlying the organic buffer film 27. The sealing layer 6 covering the light-emitting element layer 5 inhibits foreign matter such as water and oxygen from penetrating the light-emitting element layer 5.

Each of the inorganic sealing film 26 and the inorganic sealing film 28 is an inorganic insulating film and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as an acrylic. The organic buffer film 27 can be formed, for example, by ink-jet application, and a bank for stopping droplets may be provided in the non-display region.

The lower face film 10 is, for example, a PET film bonded in a lower face of the resin layer 12 after the support substrate is peeled, to realize a display device having excellent flexibility. The function film 39 has at least one of an optical compensation function, a touch sensor function, and a protection function, for example.

A flexible display device was described above, but when a non-flexible display device is to be manufactured, ordinarily, the formation of a resin layer, and the replacement of the base material, etc. are not required, and therefore, for example, the processes of layering on a glass substrate of steps S2 to step S5 are implemented, after which the manufacturing process moves to step S9.

Figure 3:
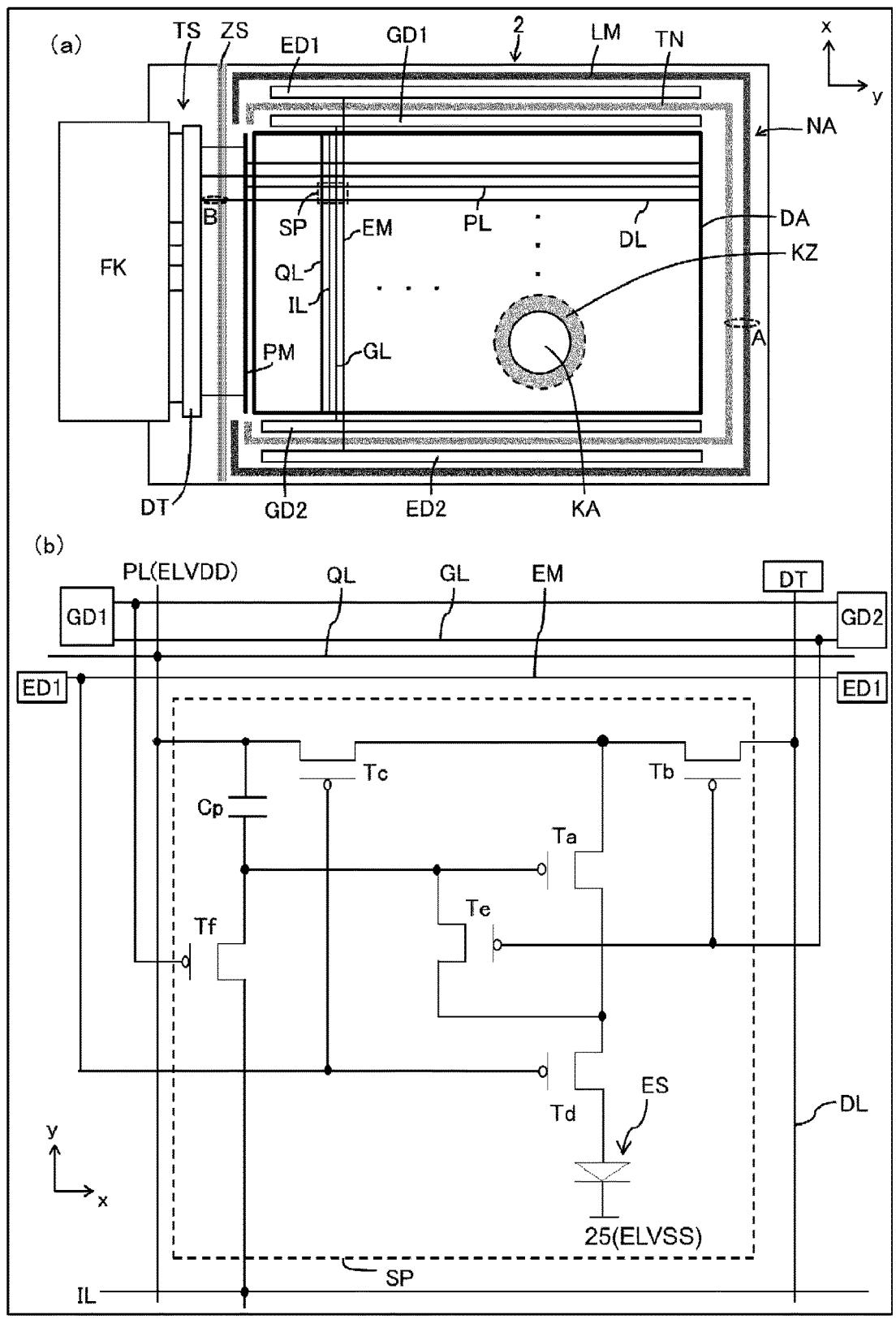
FIG. 3(a) is a plan view illustrating a configuration of the display device.
FIG. 3(b) is a circuit diagram illustrating a circuit configuration of a subpixel included in the display region.

FIG. 3(a) is a plan view illustrating a configuration of the display device, and FIG. 3(b) is a circuit diagram illustrating a circuit configuration of a subpixel included in the display region. As illustrated in FIG. 3, a display device 2 includes a display region DA including a plurality of subpixels SP and a frame region (non-display region) NA surrounding the display region DA. The display region DA is provided with a plurality of scanning signal lines GL extending in an x-direction, a plurality of data signal lines DL extending in a y-direction orthogonal to the x-direction, a plurality of light emission control lines EM extending in the x-direction, a plurality of upper layer power source lines PL extending in the y-direction, a plurality of initialization power source lines IL extending in the x-direction, and a plurality of lower layer power source lines QL extending in the x-direction. The upper layer power source line PL is supplied with ELVDD via a trunk wiring line PM, and the upper layer power source line PL is electrically connected to the lower layer power source line QL.

A subpixel circuit SP including the light-emitting element ES is connected to the data signal line DL, the scanning signal line GL, the light emission control line EM, the upper layer power source line PL or the lower layer power source line QL, and the initialization power source line IL. Note that one of electrodes of a capacitance Cp is connected to the upper layer power source line PL or the lower layer power source line QL, and the other electrode is connected to a gate terminal of a drive transistor Ta. The drive transistor Ta includes a gate terminal connected to the scanning signal line GL, a source terminal connected to the data signal line DL via a write transistor Tb, and a drain terminal connected to the light-emitting element ES via a transistor Td. The data signal line DL is connected to a driver chip DT, the scanning signal line GL is connected to scanning signal line drive circuits GD1 and GD2, and the light emission control line EM is connected to light emission control circuits ED1 and ED2. The scanning signal line drive circuits GD1 and GD2, and the light emission control circuits ED1 and ED2 are formed monolithically in the TFT layer 4 included in the frame region NA. The frame region NA is provided with a trench TN, a bending portion ZS, and a trunk wiring line LM (for ELVSS).

The scanning signal line drive circuits GD1 and GD2 are disposed on both sides of the display region DA in a short-side direction so as to sandwich the display region DA. The light emission control circuits ED1 and ED2 are disposed on both sides of the display region DA in the short-side direction so as to sandwich the display region DA. Note that the light emission control circuits ED1 and ED2 are located outside (closer to an edge of the device than) the scanning signal line drive circuits GD1 and GD2.

The driver chip DT (data signal line drive circuit) is mounted on a terminal section TS of the frame region NA, and the data signal line DL and the trunk wiring line PM are connected to the driver chip DT. The data signal line DL may be connected to the driver chip DT via an SSD circuit (a time division driving switch circuit that is formed monolithically in the TFT layer 4). A flexible circuit substrate FK (a substrate on which a processor, power source circuit, or the like is mounted) is connected to the terminal section TS.

In the first embodiment, a through-hole KA and a surrounding region KZ surrounding the through-hole KA are disposed inside the edge of the display region DA. The through-hole KA (for example, the imaging hole) has an opening of a size that can bridges the plurality of wiring lines (the plurality of data signal lines and the plurality of scanning signal lines).

Figure 4:
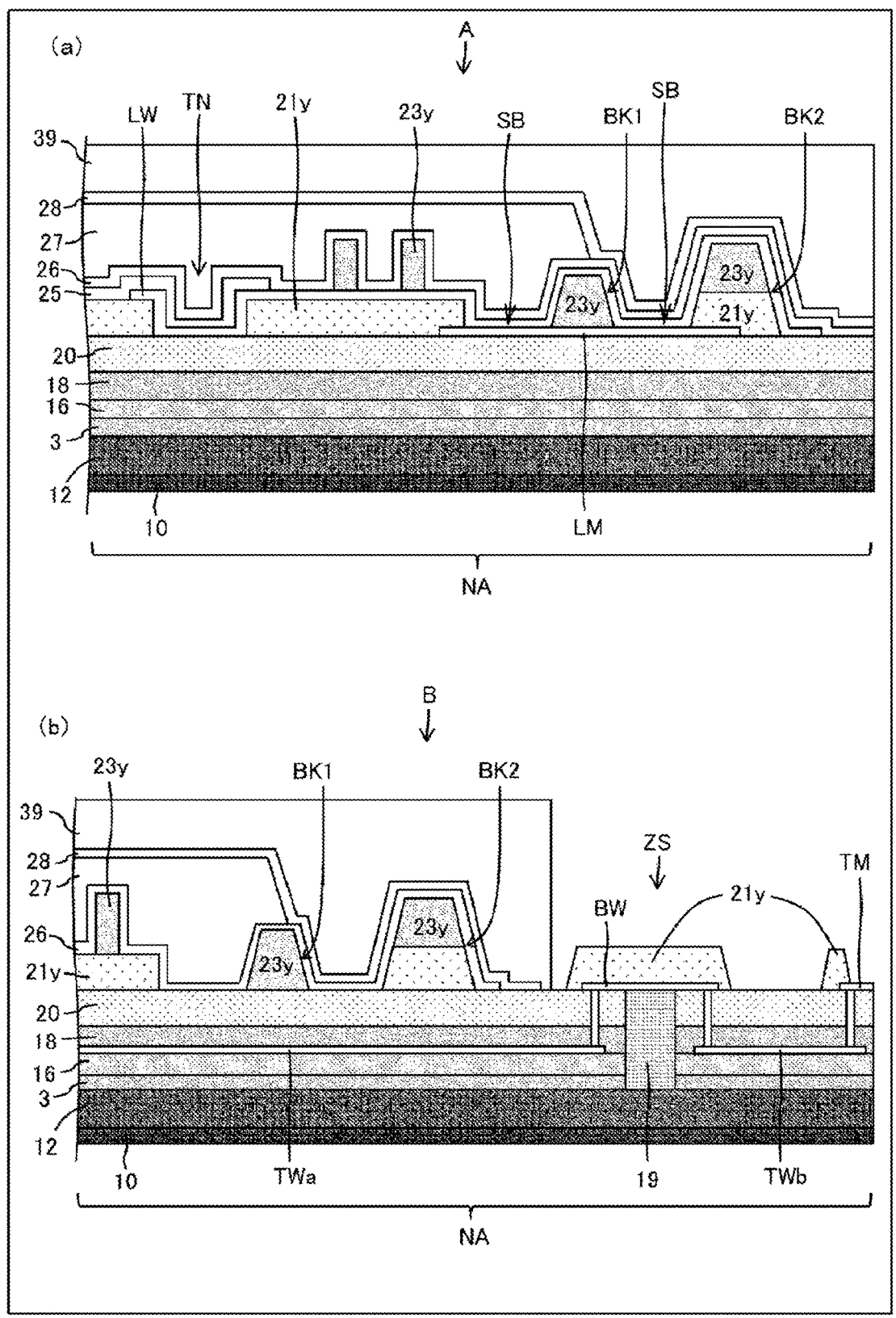
FIG. 4(a) is a cross-sectional view illustrating a configuration around a trench.
FIG. 4(b) is a cross-sectional view illustrating a configuration example of a bending portion.

FIG. 4(a) is a cross-sectional view illustrating a configuration around a trench, and FIG. 4(b) is a cross-sectional view illustrating a configuration example of a bending portion. As illustrated in FIG. 4(a), an organic insulating film 21y in the same layer as the flattening film 21 in FIG. 2 and an organic insulating film 23y in the same layer as the edge cover 23 in FIG. 2 are penetrated at the trench TN, and the cathode 25 in FIG. 2 is connected to a relay wiring line LW in the same layer as the anode 22 in the trench TN. The organic insulating film 21y in the same layer as the flattening film 21 in FIG. 2 and the organic insulating film 23y in the same layer as the edge cover 23 in FIG. 2 are penetrated in a connection section SB, and the relay wiring line LW is connected to the trunk wiring line LM (second metal layer) at the connection section SB. Note that banks BK1 and BK2 function as liquid stoppers for ink-jet formation of the organic buffer film 27. The barrier layer 3, the gate insulating film 16, the first inorganic insulating film 18, and the second inorganic insulating film 20 are penetrated at the bending portion ZS, and a penetrated space thereof is filled with the organic insulating film 19. A terminal wiring line TWa (first metal layer) electrically connected to the display region DA is connected to a terminal TM (second metal layer) via a bridge wiring line BW (second metal layer) and a terminal wiring line TWB (first metal layer) in the bending portion ZS. Note that the metal layers of the terminal wiring line TWa, the terminal wiring line TWB, and the bridge wiring line BW are examples, and these wiring lines may be formed from other metal layers. Edges of the bridge wiring line BW and the terminal TM are covered with the organic insulating film 21y.

Figure 5:
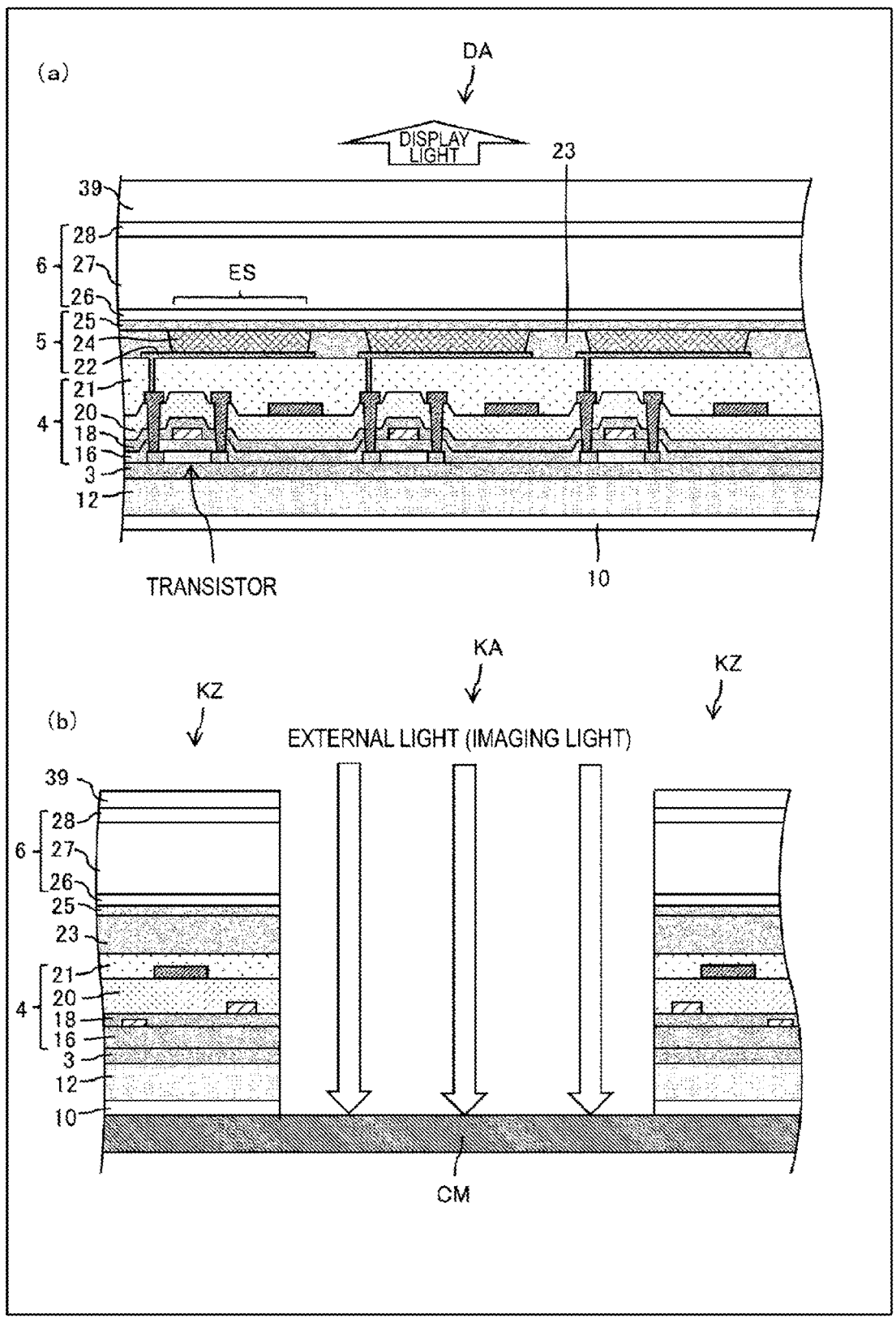
FIG. 5(a) is a cross-sectional view illustrating a configuration of other than a through-hole and a surrounding region inside an edge of the display region.
FIG. 5(b) is a cross-sectional view illustrating a configuration of the through-hole and the surrounding region.

FIG. 5(a) is a cross-sectional view illustrating a configuration of other than a through-hole and a surrounding region inside an edge of the display region, and FIG. 5(b) is a cross-sectional view illustrating a configuration of the through-hole and the surrounding region. As illustrated in FIG. 5, the light-emitting elements ES are provided in a region AD other than the through-hole and the surrounding region inside the edge of the display region. The through-hole KA penetrates from the lower face film 10 to a function film 39 to form an external light (imaging light) transmission path. As a result, an imaging device CM, a switch, or the like can be provided so as to overlap the through-hole KA. The surrounding region KZ is a region in which the wiring line is drawn, and the light-emitting element is not formed (a non-display region).

First Embodiment

FIG. 6(a) is a plan view illustrating a configuration around the through-hole KA in a first embodiment, and FIG. 6(b) to FIG. 6(e) are cross-sectional views of FIG. 6(a).

As illustrated in FIG. 6(a), scanning signal lines GL1, GL2, and GL3 (first bypass wiring lines) which are drawn in the surrounding region KZ to bypass the through-hole KA are included in the plurality of scanning signal lines formed in the first metal layer, light-emitting control lines EM1, EM2, and EM3 (first divided wiring lines) which are divided onto one side and the other side of the through-hole KA are included in the plurality of light emission control lines formed in the first metal layer, data signal lines DL1 and DL2 (second bypass wiring lines) which are drawn in the surrounding region KZ to bypass the through-hole KA are included in the plurality of data signal lines formed in the second metal layer, and upper layer power source lines PL1 and PL2 (second divided wiring lines) which are divided onto one side and the other side of the through-hole KA are included in the plurality of upper layer power source lines formed in the second metal layer.

As illustrated in FIG. 6(b), the data signal line DL1 overlaps the light emission control line EM1 with the first inorganic insulating film 18 and the second inorganic insulating film 20 interposed therebetween in the surrounding region KZ. As illustrated in FIG. 6(c), a lead wiring line F1 (first lead wiring line) formed in the first metal layer and a lead wiring line F2 (second lead wiring line) formed in the second metal layer are provided, the light emission control line EM2 contacts the lead wiring line F2 through a contact hole formed in the first inorganic insulating film 18 and the second inorganic insulating film 20 in the surrounding region KZ, and the lead wiring line F2 overlaps the scanning signal line GL2 with the first inorganic insulating film 18 and the second inorganic insulating film 20 interposed therebetween in the surrounding region KZ. Furthermore, the lead wiring lines F2 contacts the lead wiring line F1 through a contact hole formed in the first inorganic insulating film 18 and the second inorganic insulating film 20 in the surrounding region KZ, and the lead wiring line F1 overlaps the data signal line DL1 with the gate insulating film 16 and the first inorganic insulating film 18 interposed therebetween in the surrounding region KZ.

As illustrated in FIG. 3(a), the frame region NA surrounding the display region DA is provided with two light emission control circuits ED1 and ED2 which face each other in the x-direction via the display region DA, and two scanning signal line drive circuits GD1 and GD2 which face each other in the x-direction via the display region DA, and for example, a signal generated in one of the two light emission control circuits ED1 and ED2 is input to the light emission control line EM2 on one side of the through-hole KA, and a signal generated on the other side of the two light emission control circuits ED1 and ED2 is input to the light emission control line EM2 on the other side of the through-hole KA. For example, both ends of the scanning signal line GL2 are connected to the scanning signal line drive circuits GD1 and GD2.

As illustrated in FIG. 6(a), lower layer power source lines QL1 and QL2 (third bypass wiring lines) which are drawn in the surrounding region KZ to bypass the through-hole KA are included in the plurality of lower layer power source lines formed in the intermediate metal layer, and initialization power source lines IL1, IL2, and IL3 (third divided wiring lines) which are divided onto one side and the other side of the through-hole KA are included in the plurality of initialization power source lines formed in the intermediate metal layer. As illustrated in FIG. 6(d), for example, the lower layer power source line QL2 is electrically connected to the upper layer power source line PL1 through a contact hole formed in the second inorganic insulating film 20.

As illustrated in FIG. 6(e), a lead wiring line F3 (third lead wiring line) formed in the intermediate metal layer and a lead wiring line F4 (fourth lead wiring line) formed in the second metal layer are provided, and for example, the initialization power source line IL3 contacts the lead wiring line F4 through a contact hole formed in the second inorganic insulating film 20 in the surrounding region KZ, the lead wiring line F4 overlaps the lower layer power source line QL2 adjacent to the initialization power source line IL3 with the second inorganic insulating film 20 interposed therebetween in the surrounding region KZ, the lead wiring line F4 contacts the lead wiring line F3 through a contact hole formed in the second inorganic insulating film 20 in the surrounding region KZ, and the lead wiring line F3 overlaps the data signal line DL1 with the second inorganic insulating film 20 interposed therebetween and overlaps the scanning signal line GL2 with the first inorganic insulating film 18 interposed therebetween in the surrounding region KZ.

According to the configuration in FIG. 6(b), the data signal line DL1 has a load less (or subpixel circuits to be connected fewer), because of passing through the surrounding region KZ (bypassing the through-hole KA), than a data signal line not passing through the surrounding region KZ, and thus, a capacitance between the data signal line DL1 and the light emission control line EM1 can be added to the data signal line DL1 to allow the load to be balanced. The light emission control line EM1 has a load less (or subpixel circuits to be connected fewer), because of being disconnected by the through-hole KA, than a light emission control line not disconnected, and thus, a capacitance between the light emission control line EM1 and the data signal line DL1 can be added to the light emission control line EM1 to allow the load to be balanced.

According to the configuration in FIG. 6(e), a capacitance between the data signal line DL1 and the lead wiring line F3 can be added to the data signal line DL1 to allow the load to be balanced. A capacitance between the scanning signal line GL2 and the lead wiring line F3 can be added to the scanning signal line GL2 to allow the load to be balanced.

FIG. 7(a) is a plan view illustrating a configuration around the through-hole in the first embodiment, and FIG. 7(b) and FIG. 7(c) are cross-sectional views of FIG. 7(a). FIG. 7(a) is the same as FIG. 6(a), but is illustrated for convenience of explanation.

As illustrated in FIG. 7(b), the scanning signal line GL2 overlaps the upper layer power source line PL1 with the first inorganic insulating film 18 and the second inorganic insulating film 20 interposed therebetween in the surrounding region KZ. As illustrated in FIG. 7(c), a lead wiring line F5 (fifth lead wiring line) formed in the first metal layer and a lead wiring line F6 (sixth lead wiring line) formed in the second metal layer (are provided, the upper layer power source line PL1 contacts the lead wiring line F5 through a contact hole formed in the first inorganic insulating film 18 and the second inorganic insulating film 20 in the surrounding region KZ, and the lead wiring line F5 overlaps the data signal line DL1 adjacent to the upper layer power source line PL1 with the first inorganic insulating film 18 and the second inorganic insulating film 20 interposed therebetween in the surrounding region KZ. Furthermore, the lead wiring lines F5 contacts the lead wiring line F6 through a contact hole formed in the first inorganic insulating film 18 and the second inorganic insulating film 20 in the surrounding region KZ, and the lead wiring line F6 overlaps the scanning signal line GL1 with the inorganic insulating film 16 and the first inorganic insulating film 18 interposed therebetween in the surrounding region KZ.

According to the configuration in FIG. 7(b), the scanning signal line GL2 has a load less (or subpixel circuits to be connected fewer), because of passing through the surrounding region KZ (bypassing the through-hole KA), than a scanning signal line not passing through the surrounding region KZ, and thus, a capacitance between the scanning signal line GL and the upper layer power source line PL1 can added to the scanning signal line GL to allow the load to be balanced.

As illustrated in FIG. 7(c), the lead wiring line F6 formed in the second metal layer and the lead wiring line F5 formed in the first metal layer are provided, and for example, the upper layer power source line PL1 contacts the lead wiring line F5 through a contact hole formed in the first inorganic insulating film 18 and the second inorganic insulating film 20 in the surrounding region KZ, and the lead wiring line F5 overlaps the data signal line DL1 adjacent to the upper layer power source line PL1 with the first inorganic insulating film 18 and the second inorganic insulating film 20 interposed therebetween in the surrounding region KZ. The lead wiring lines F6 contacts the lead wiring line F5 through a contact hole formed in the first inorganic insulating film 18 and the second inorganic insulating film 20 in the surrounding region KZ, contacts the lower layer power source line QL1 with the second inorganic insulating film 20 interposed therebetween, and overlaps the scanning signal line GL1 with the first inorganic insulating film 18 and the second inorganic insulating film 20 interposed therebetween in the surrounding region KZ. Note that the lead wiring line F5 may be provided in the intermediate metal layer, but is preferably provided in the first metal layer from coupling with the data signal line.

According to the configuration in FIG. 7(c), a capacitance between the data signal line DL1 and the lead wiring line F5 can be added to the data signal line DL1 to allow the load to be balanced. A capacitance between the scanning signal line GL1 and the lead wiring line F6 can be added to the scanning signal line GL1 to allow the load to be balanced.

Figure 6:
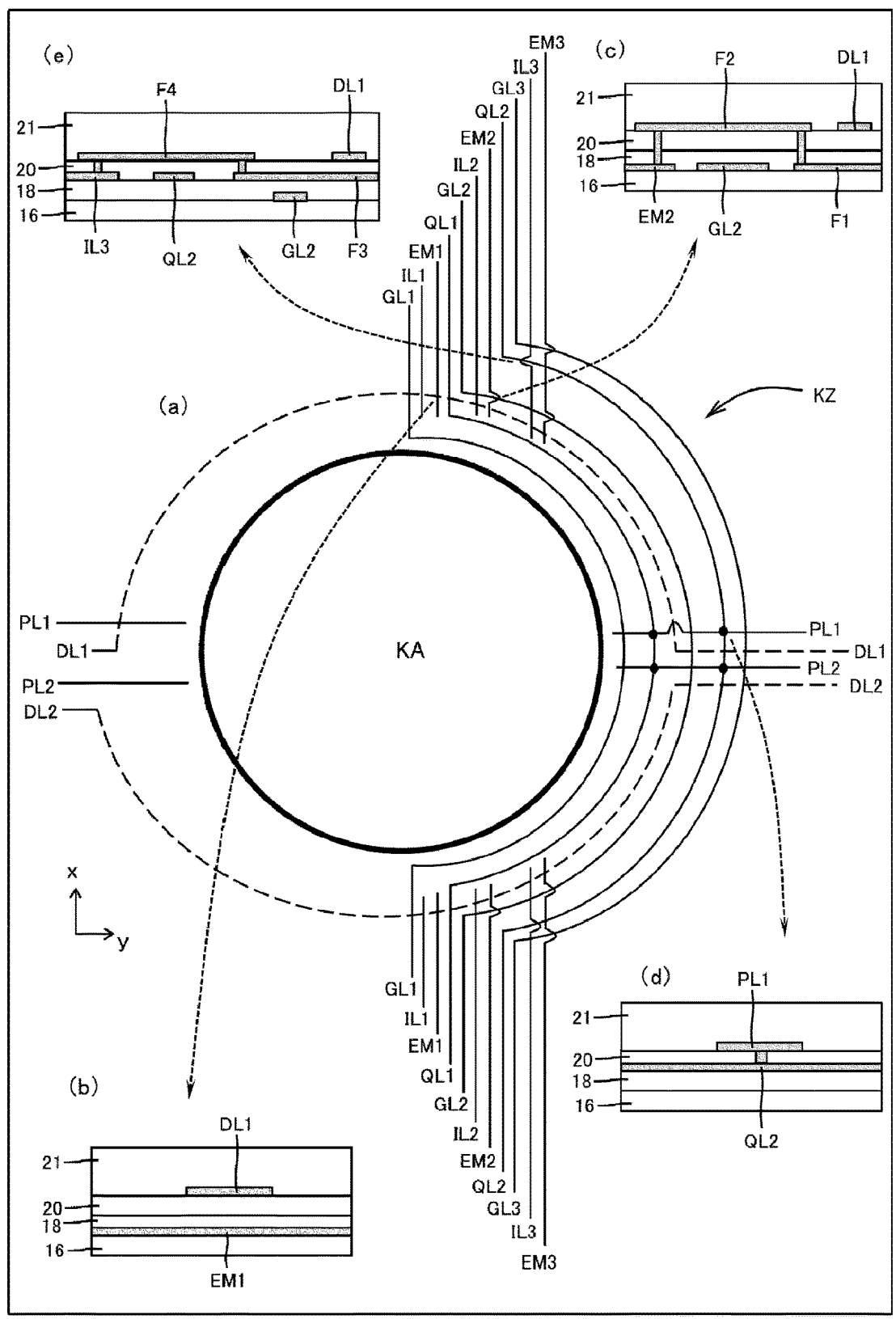
FIG. 6(a) is a plan view illustrating a configuration around a through-hole in a first embodiment.
FIG. 6(b) to FIG. 6(e) are cross-sectional views of FIG. 6(a).
Figure 7:
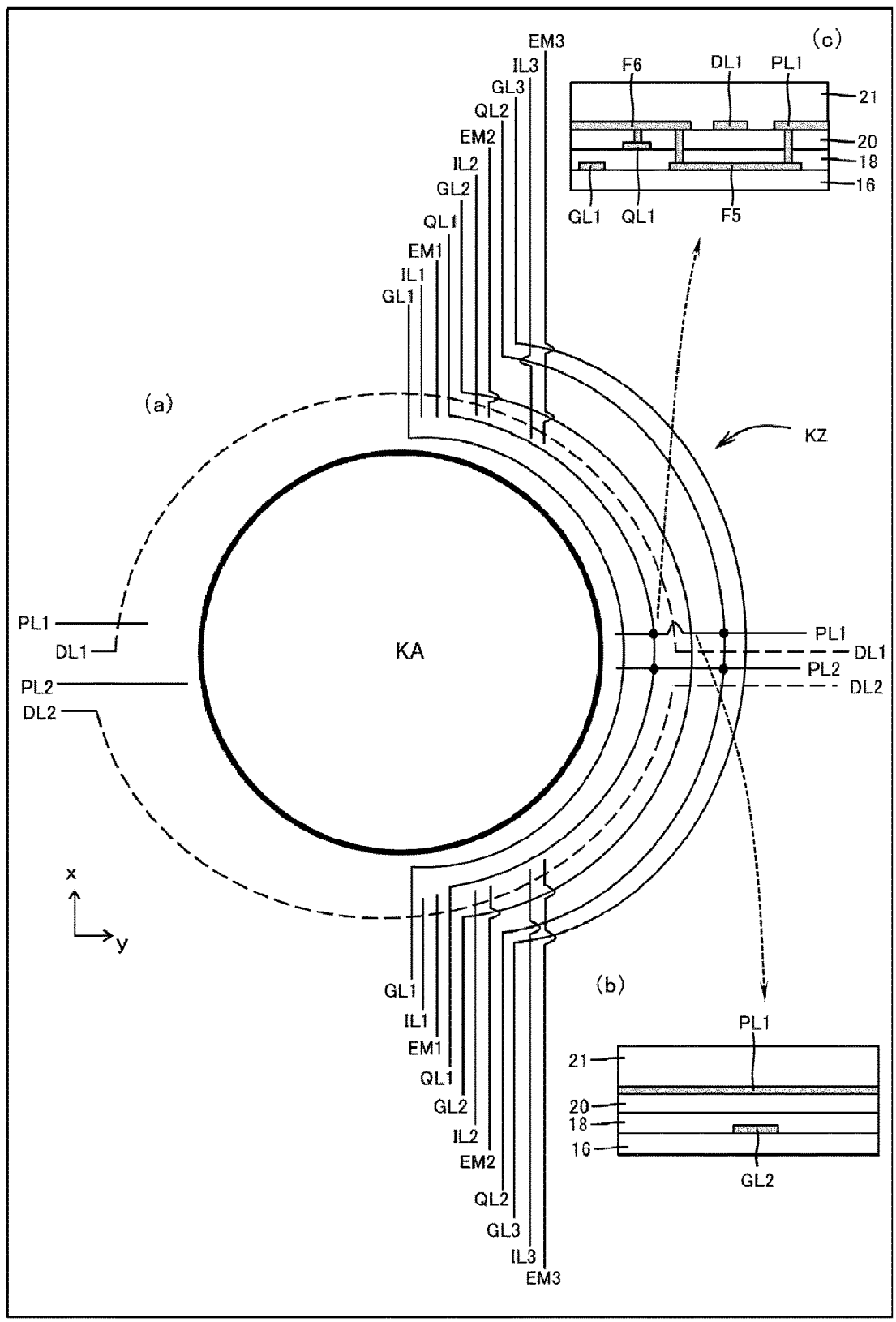
FIG. 7(a) is a plan view illustrating a configuration around the through-hole in the first embodiment.
FIG. 7(b) and FIG. 7(c) are cross-sectional views of FIG. 7(a).

According to the configurations in FIG. 6 and FIG. 7, a capacitance between the data signal line DL1 and the lead wiring line F1 and a capacitance between the data signal line DL1 and the lead wiring line F3 can be added to the data signal line DL1 to allow the load to be balanced. The scanning signal line GL1 has a load less (or subpixel circuits to be connected fewer), because of passing through the surrounding region KZ (bypassing the through-hole KA), than a scanning signal line not passing through the surrounding region KZ, and thus, a capacitance between the scanning signal line GL1 and the lead wiring line F6 can added to the scanning signal line GL1 to allow the load to be balanced.

As described above, according to the first embodiment, the through-hole KA available for imaging, sensing, or the like can be provided while suppressing negative effects on the display.

Second Embodiment

Figure 8:
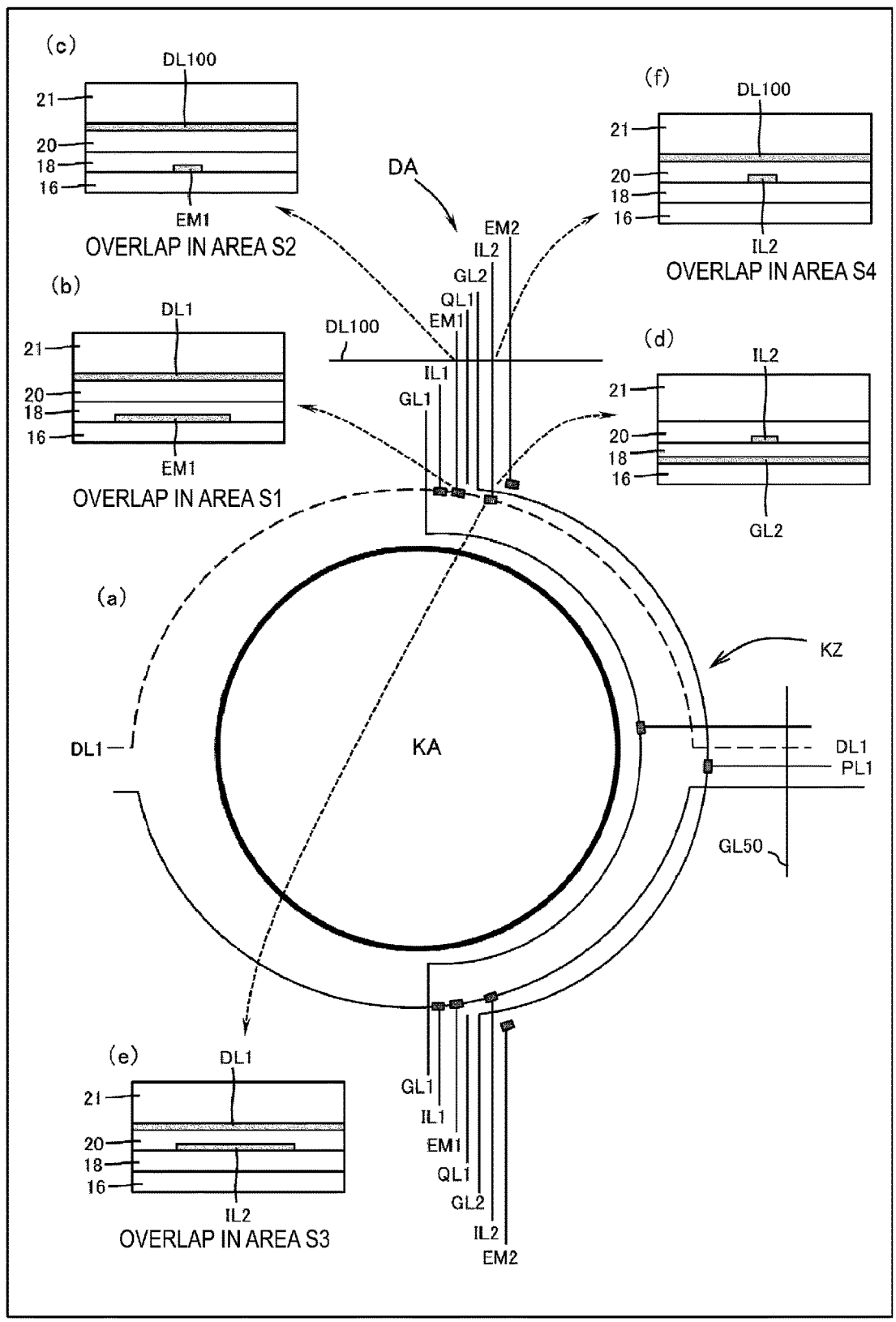
FIG. 8(a) is a plan view illustrating a configuration around a through-hole in a second embodiment.
FIG. 8(b) to FIG. 8(f) are cross-sectional views of FIG. 8(a).
Figure 9:
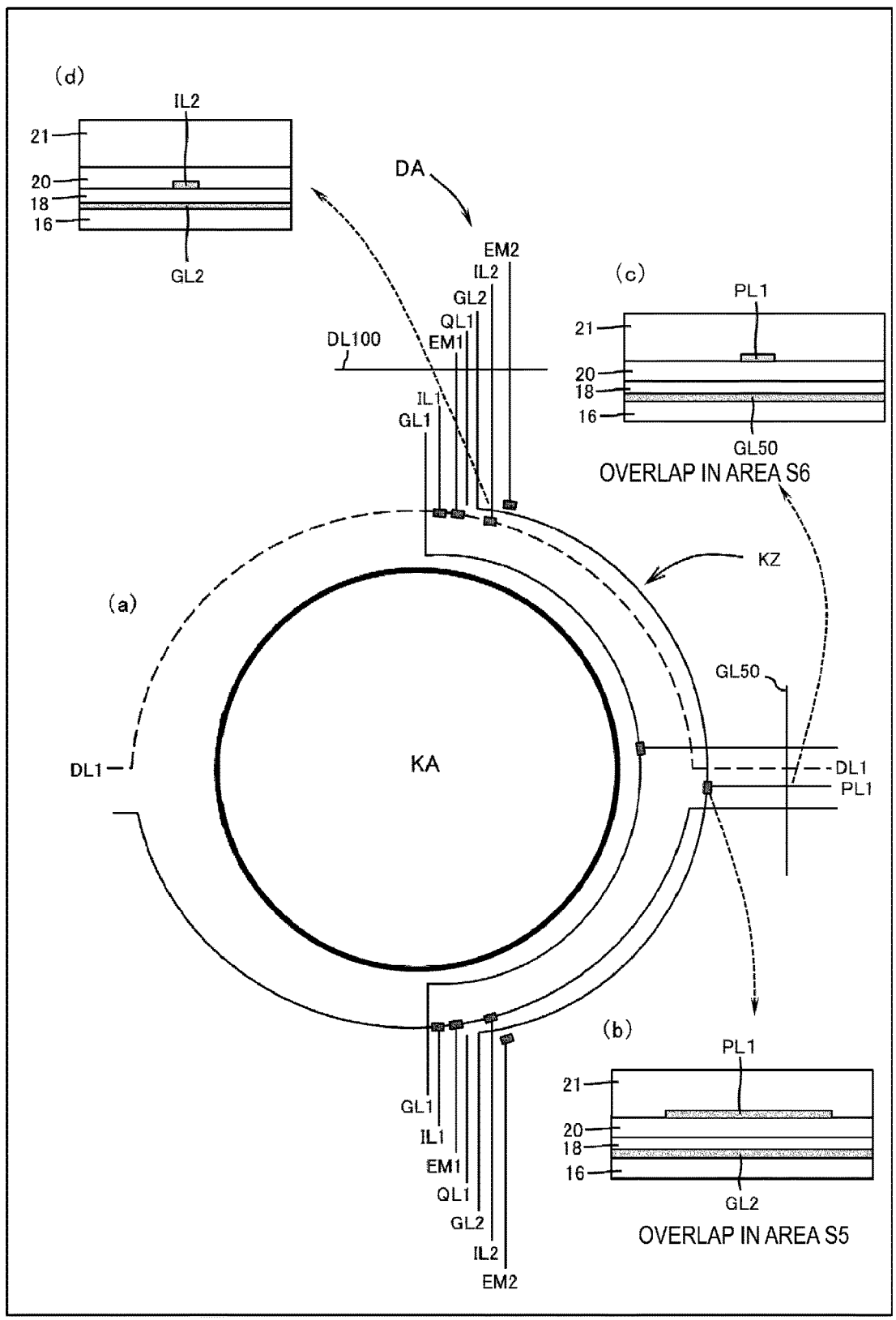
FIG. 9(a) is a plan view illustrating a configuration around the through-hole in the second embodiment.
FIG. 9(b) to FIG. 9(d) are cross-sectional views of FIG. 9(a).

FIG. 8(a) is a plan view illustrating a configuration around a through-hole in a second embodiment, and FIG. 8(b) to FIG. 8(f) are cross-sectional views of FIG. 8(a). FIG. 9(a) is a plan view illustrating a configuration around the through-hole in the second embodiment, and FIG. 9(b) to FIG. 9(d) are cross-sectional views of FIG. 9(a). FIG. 9(a) is the same as FIG. 8(a), but is illustrated for convenience of explanation.

In the second embodiment, no lead wiring line is provided, and in FIG. 8(b) and FIG. 8(c), the light emission control line EM1 serving as the first divided wiring line overlaps the data signal line DL1 serving as the second bypass wiring line with an area S1 (first area) of overlap with the first inorganic insulating film 18 and the second inorganic insulating film 20 interposed therebetween in the surrounding region KZ, and the light emission control line EM1 serving as the first divided wiring line overlaps a data signal line DL100 not serving as the second bypass wiring line with an area S2 (second area) of overlap with the first inorganic insulating film 18 and the second inorganic insulating film 20 interposed therebetween in the display region DA, where area S1>area S2.

In FIG. 8(d) to FIG. 8(f), the initialization power source line IL2 serving as the third divided wiring line overlaps the scanning signal line GL2 serving as the first bypass wiring line with the first inorganic insulating film 18 interposed therebetween, and overlaps the data signal line DL1 serving as the second bypass wiring with an area S3 (third area) of overlap with the second inorganic insulating film 20 interposed therebetween in the surrounding region KZ, and the initialization power source line IL2 serving as the third divided wiring line overlaps the data signal line DL100 not serving as the second bypass wiring with an area S4 (fourth area) of overlap with the second inorganic insulating film 20 interposed therebetween in the display region DA, where area S3>area S4.

The data signal line DL1 passing through the surrounding region KZ (bypassing the through-hole KA) has subpixel circuits to be connected fewer compared to the data signal line DL100 not passing through the surrounding region KZ, and thus, has the load smaller. According to the configurations in FIG. 8(b) and FIG. 8(e), a capacitance between the data signal line DL1 and the light emission control line EM1 and a capacitance between the data signal line DL1 and the initialization power source line IL2 can be added to the data signal line DL1 to allow the load to be balanced. According to the configuration in FIG. 8(d), the scanning signal line GL2 has a load less (or subpixel circuits to be connected fewer), because of passing through the surrounding region KZ (bypassing the through-hole KA), than a scanning signal line not passing through the surrounding region KZ, and thus, a capacitance between the scanning signal line GL2 and the initialization power source line IL2 can added to the scanning signal line GL2 to allow the load to be balanced.

In FIG. 9(a) to FIG. 9(c), the upper layer power source line PL serving as the second divided wiring line overlaps the scanning signal line GL2 serving as the first bypass wiring line with an area S5 (fifth area) of overlap with the first inorganic insulating film 18 and the second inorganic insulating film 20 interposed therebetween in the surrounding region KZ, and the upper layer power source line PL1 serving as the second divided wiring line overlaps a scanning signal line GL50 not serving as the first bypass wiring line with an area S6 (sixth area) of overlap with the first inorganic insulating film 18 and the second inorganic insulating film 20 interposed therebetween in the display region DA, where area S5>area S6.

The scanning signal line GL2 passing through the surrounding region KZ (bypassing the through-hole KA) has subpixel circuits to be connected fewer compared to the scanning signal line GL50 not passing through the surrounding region KZ, and thus, has the load smaller. As illustrated in FIG. 9(b) and FIG. 9(d), a capacitance between the scanning signal line GL2 and the upper layer power source line PL1 and a capacitance between the scanning signal line GL2 and the initialization power source line IL2 can be added to the scanning signal line GL2 to allow the load to be balanced.

As described above, according to the second embodiment, the through-hole KA available for imaging, sensing, or the like can be provided while suppressing negative effects on the display.

Third Embodiment

In the first and second embodiments, the scanning signal lines GL1 and GL2 are made to bypass and the light emission control lines EM1 and EM2 are disconnected, but the disclosure is not limited thereto. The scanning signal lines GL1 and GL2 may be disconnected and the light emission control lines EM1 and EM2 may be made to bypass. The scanning signal lines GL1 and GL2 and the light emission control lines EM1 and EM2 may be made to bypass (all wiring lines formed in the first metal layer and straightly drawn to cross the through-hole KA are made to bypass). The scanning signal lines GL1 and GL2 and the light emission control lines EM1 and EM2 may be disconnected (all wiring lines formed in the first metal layer and straightly drawn to cross the through-hole KA are disconnected).

In the first and second embodiments, the data signal lines DL1 and DL2 are made to bypass and the upper layer power source lines PL1 and PL2 are disconnected, but the disclosure is not limited thereto. The data signal lines DL1 and DL2 may be disconnected and the upper layer power source lines PL1 and PL2 may be made to bypass. The data signal lines DL1 and DL2 and the upper layer power source lines PL1 and PL2 may be made to bypass (all wiring lines formed in the second metal layer and straightly drawn to cross the through-hole KA are made to bypass). The data signal lines DL1 and DL2 and the upper layer power source lines PL1 and PL2 may be disconnected (all wiring lines formed in the second metal layer and straightly drawn to cross the through-hole KA are disconnected).

In the first and second embodiments, the lower layer power source lines QL1 and QL2 are made to bypass and the initialization power source lines IL1 and IL2 are disconnected, but the disclosure is not limited thereto. The lower layer power source lines QL1 and QL2 may be disconnected, and the initialization power source lines IL1 and IL2 may be made to bypass. The lower layer power source lines QL1 and QL2 and the initialization power source lines IL1 and IL2 may be made to bypass (all wiring lines formed in the intermediate metal layer and straightly drawn to cross the through-hole KA are made to bypass). The lower layer power source lines QL1 and QL2 and the initialization power source lines IL1 and IL2 may be disconnected (all wiring lines formed in the intermediate metal layer and straightly drawn to cross the through-hole KA are disconnected).

First to Third Embodiments

At least one of the first metal layer, the intermediate metal layer, and the second metal layer may be provided with the divided wiring line and the bypass wiring line. In other words, at least one kind of the plurality of scanning signal lines, the plurality of light emission control lines, the plurality of data signal lines, and the plurality of upper layer power source lines may be provided with the bypass wiring line that passes through the surrounding region KZ to bypass the through-hole KA, and the other wiring lines formed in the same metal layer as the bypass wiring line may be disconnected with the through-hole KA sandwiched therebetween.

The type of divided wiring line and bypass wiring line in each embodiment (e.g., the divided wiring line is a light emission control line and the bypass wiring line is a scanning signal line) is not limited to the configuration described above, and can be changed as appropriate within a scope that does not affect the display.

Supplement

First Aspect

A display device including:
a substrate;
a first metal layer, a first inorganic insulating film, and a second metal layer in this order on the substrate;
a display region provided with a plurality of scanning signal lines and a plurality of light emission control lines included in the first metal layer, the plurality of light emission control lines extending parallel to the plurality of scanning signal lines, and provided with a plurality of data signal lines and a plurality of upper layer power source lines crossing the plurality of scanning signal lines and included in the second metal layer;
a through-hole and a surrounding region surrounding the through-hole inside an edge of the display region;
at least one of configurations, in one of the configurations, the first metal layer includes a first bypass wiring line bypassing the through-hole in the surrounding region and a first divided wiring line divided onto one side and the other side of the through-hole, and in the other of the configurations, the second metal layer includes a second bypass wiring line bypassing the through-hole in the surrounding region and a second divided wiring line divided onto one side and the other side of the through-hole.

Second Aspect

The display device according to the first aspect, for example, wherein the first bypass wiring line is included in the plurality of scanning signal lines, and the first divided wiring line is included in the plurality of light emission control lines.

Third Aspect

The display device according to the second aspect, for example, wherein the second bypass wiring line is included in the plurality of data signal lines.

Fourth Aspect

The display device according to the second aspect, for example, wherein the second bypass wiring line is included in the plurality of upper layer power source lines.

Fifth Aspect

The display device according to the third or fourth aspect, for example, wherein the second bypass wiring line overlaps the first divided wiring line with the first inorganic insulating film interposed between the second bypass wiring line and the first divided wiring line in the surrounding region.

Sixth Aspect

The display device according to the third or fourth aspect, for example, wherein a first lead wiring line included in the first metal layer and a second lead wiring line included in the second metal layer are provided,
the first divided wiring line contacts the second lead wiring line through a contact hole formed in the first inorganic insulating film in the surrounding region, the second lead wiring line overlaps the first bypass wiring line with the first inorganic insulating film interposed between the second lead wiring line and the first bypass wiring line in the surrounding region, the first bypass wiring line being adjacent to the first divided wiring line, the second lead wiring line contacts the first lead wiring line through a contact hole formed in the first inorganic insulating film in the surrounding region, and the first lead wiring line overlaps the second bypass wiring line with the first inorganic insulating film interposed between the first lead wiring line and the second bypass wiring line in the surrounding region.

Seventh Aspect

The display device according to the fifth aspect, for example, wherein the first divided wiring line overlaps the second bypass wiring line with a first area of overlap with the first inorganic insulating film interposed between the first divided wiring line and the second bypass wiring line in the surrounding region, the first divided wiring line overlaps the data signal line other than the second bypass wiring line or the upper layer power source line other than the second bypass wiring line with a second area of overlap with the first inorganic insulating film interposed between the first divided wiring line and the data signal line or the upper layer power source line in the display region, and the first area>the second area.

Eighth Aspect

The display device according to any one of the second to seventh aspects, for example, wherein a frame region surrounding the display region includes two light emission control circuits facing each other in a direction parallel to the plurality of data signal lines via the display region, and two scanning signal line drive circuits facing each other in the direction parallel to the plurality of data signal lines via the display region, signals generated by the two scanning signal line driving circuits are input to both ends of each of the plurality of scanning signal lines, and signal generated by the two light emission control circuits are input to both ends of each of the plurality of light emission control lines not crossing the surrounding region and both ends of each of the plurality of light emission control lines divided.

Ninth Aspect

The display device according to the third or fourth aspect, for example, wherein the first inorganic insulating film, an intermediate metal layer, a second inorganic insulating film, and the second metal layer are layered in this order, the display region is provided with a plurality of initialization power source lines and a plurality of lower layer power source lines extending parallel to the plurality of scanning signal lines and included in the intermediate metal layer, the plurality of lower layer power source lines are electrically connected to the plurality of upper layer power source lines through contact holes formed in the second inorganic insulating film, the intermediate metal layer includes a third bypass wiring line bypassing the through-hole in the surrounding region, the intermediate metal layer includes a third divided wiring line divided onto one side and the other side of the through-hole, the plurality of lower layer power source lines includes the third bypass wiring line, and the plurality of initialization power source lines includes the third divided wiring line.

Tenth Aspect

The display device according to the ninth aspect, for example, wherein a third lead wiring line included in the intermediate metal layer and a fourth lead wiring line included in the second metal layer are provided, the third divided wiring line contacts the fourth lead wiring line through a contact hole formed in the second inorganic insulating film in the surrounding region, the fourth lead wiring line overlaps the third bypass wiring line with the second inorganic insulating film interposed between the fourth lead wiring line and the third bypass wiring line in the surrounding region, the third bypass wiring line being adjacent to the third divided wiring line, the fourth lead wiring line contacts the third lead wiring line through a contact hole formed in the second inorganic insulating film in the surrounding region, and the third lead wiring line overlaps the second bypass wiring line with the second inorganic insulating film interposed between the third lead wiring line and the second bypass wiring line, and overlaps the first bypass wiring line with the first inorganic insulating film interposed between the third lead wiring line and the first bypass wiring line in the surrounding region.

Eleventh Aspect

The display device according to the ninth aspect, for example, wherein the third divided wiring line overlaps the first bypass wiring line with the first inorganic insulating film interposed between the third divided wiring line and the first bypass wiring line, and overlaps the second bypass wiring line with a third area of overlap with the second inorganic insulating film interposed between the third divided wiring line and the second bypass wiring line in the surrounding region, the third divided wiring line overlaps the data signal line other than the second bypass wiring line or the upper layer power source line other than the second bypass wiring line with a fourth area of overlap with the second inorganic insulating film interposed between the third divided wiring line and the data signal line or the upper layer power source line in the display region, and the third area>the fourth area.

Twelfth Aspect

The display device according to the first aspect, for example, wherein the second bypass wiring line is included in the plurality of data signal lines, and the second divided wiring line is included in the plurality of upper layer power source lines.

Thirteenth Aspect

The display device according to the twelfth aspect, for example, wherein the first bypass wiring line is included in the plurality of scanning signal lines.

Fourteenth Aspect

The display device according to the twelfth aspect, for example, wherein the first bypass wiring line is included in the plurality of light emission control lines.

Fifteenth Aspect

The display device according to the thirteenth or fourteenth aspect for example, wherein the first bypass wiring line overlaps the second divided wiring line with the first inorganic insulating film interposed between the first bypass wiring line and the second divided wiring line in the surrounding region.

Sixteenth Aspect

The display device according to the thirteenth or fourteenth aspect, for example, wherein a fifth lead wiring line included in the first metal layer and a sixth lead wiring line included in the second metal layer are provided, the second divided wiring line contacts the fifth lead wiring line through a contact hole formed in the first inorganic insulating film in the surrounding region, the fifth lead wiring line overlaps the second bypass wiring line with the first inorganic insulating film interposed between the fifth lead wiring line and the second bypass wiring line in the surrounding region, the second bypass wiring line being adjacent to the second divided wiring line, the fifth lead wiring line contacts the sixth lead wiring line through a contact hole formed in the first inorganic insulating film in the surrounding region, and the sixth lead wiring line overlaps the first bypass wiring line with the first inorganic insulating film interposed between the sixth lead wiring line and the first bypass wiring line in the surrounding region.

Seventeenth Aspect

The display device according to the thirteenth or fourteenth aspect, for example, wherein the second divided wiring line overlaps the first bypass wiring line with a fifth area of overlap with the first inorganic insulating film interposed between the second divided wiring line and the first bypass wiring line in the surrounding region, the second divided wiring line overlaps the scanning signal line other than the first bypass wiring line or the light emission control line other than the first bypass wiring line with a sixth area of overlap with the first inorganic insulating film interposed between the second divided wiring line and the scanning signal line or the light emission control line in the display region, and the fifth area>the sixth area.

Eighteenth Aspect

The display device according to the thirteenth or fourteenth aspect, for example, wherein the first inorganic insulating film, an intermediate metal layer, a second inorganic insulating film, and the second metal layer are layered in this order, the display region is provided with a plurality of initialization power source lines and a plurality of lower layer power source lines extending parallel to the plurality of scanning signal lines and included in the intermediate metal layer, the plurality of lower layer power source lines are electrically connected to the plurality of upper layer power source lines through contact holes formed in the second inorganic insulating film, the intermediate metal layer includes a third bypass wiring line bypassing the through-hole in the surrounding region, the intermediate metal layer includes a third divided wiring line divided onto one side and the other side of the through-hole, the plurality of lower layer power source lines includes the third bypass wiring line, and the plurality of initialization power source lines includes the third divided wiring line.

Nineteenth Aspect

The display device according to the eighteenth aspect, for example, wherein a third lead wiring line included in the intermediate metal layer and a fourth lead wiring line included in the second metal layer are provided, the third divided wiring line contacts the fourth lead wiring line through a contact hole formed in the second inorganic insulating film in the surrounding region, the fourth lead wiring line overlaps the third bypass wiring line with the second inorganic insulating film interposed between the fourth lead wiring line and the third bypass wiring line in the surrounding region, the third bypass wiring line being adjacent to the third divided wiring line, the fourth lead wiring line contacts the third lead wiring line through a contact hole formed in the second inorganic insulating film in the surrounding region, and the third lead wiring line overlaps the second bypass wiring line with the second inorganic insulating film interposed between the third lead wiring line and the second bypass wiring line, and overlaps the first bypass wiring line with the first inorganic insulating film interposed between the third lead wiring line and the first bypass wiring line in the surrounding region.

Twentieth Aspect

The display device according to the eighteenth aspect, for example, wherein the third divided wiring line overlaps the first bypass wiring line with the first inorganic insulating film interposed between the third divided wiring line and the first bypass wiring line, and overlaps the second bypass wiring line with a third area of overlap with the second inorganic insulating film interposed between the third divided wiring line and the second bypass wiring line in the surrounding region, the third divided wiring line overlaps the data signal line other than the second bypass wiring line with a fourth area of overlap with the second inorganic insulating film interposed between the third divided wiring line and the data signal line or in the display region, and the third area>the fourth area.

Twenty-First Aspect

The display device according to the eighteenth aspect, for example, wherein a sixth lead wiring line included in the second metal layer and a fifth lead wiring line included in the first metal layer are provided, the upper layer power source line serving as the second divided wiring line contacts the fifth lead wiring line through a contact hole formed in the first inorganic insulating film and the second inorganic insulating film in the surrounding region, the fifth lead wiring line overlaps the data signal line with the first inorganic insulating film and the second inorganic insulating film interposed between the fifth lead wiring line and the data signal line in the surrounding region, the data signal line being adjacent to the upper layer power source line serving as the second divided wiring line, and the sixth lead wiring line contacts the fifth lead wiring line through a contact hole formed in the first inorganic insulating film and the second inorganic insulating film in the surrounding region, contacts the lower layer power source line serving as the third bypass wiring line with the second inorganic insulating film interposed between the sixth lead wiring line and the lower layer power source line, and overlaps the scanning signal line serving as the first bypass wiring line with the first inorganic insulating film and the second inorganic insulating film interposed between the sixth lead wiring line and the scanning signal line.

The invention claimed is:

1. A display device comprising:
   a substrate;
   a first metal layer, a first inorganic insulating film, and a second metal layer in this order on the substrate;
   a display region provided with a plurality of scanning signal lines and a plurality of light emission control lines included in the first metal layer, the plurality of light emission control lines extending parallel to the plurality of scanning signal lines, and provided with a plurality of data signal lines and a plurality of upper layer power source lines crossing the plurality of scanning signal lines and included in the second metal layer; and
   a through-hole and a surrounding region surrounding the through-hole inside an edge of the display region, wherein
   at least one of configurations, in one of the configurations, the first metal layer includes a first bypass wiring line bypassing the through-hole in the surrounding region and a first divided wiring line divided onto one side and the other side of the through-hole, and in the other of the configurations, the second metal layer includes a second bypass wiring line bypassing the through-hole in the surrounding region and a second divided wiring line divided onto one side and the other side of the through-hole,
   the first bypass wiring line is included in the plurality of scanning signal lines, and the first divided wiring line is included in the plurality of light emission control lines,
   the second bypass wiring line is included in the plurality of data signal lines,
   a first lead wiring line included in the first metal layer and a second lead wiring line included in the second metal layer are provided,
   the first divided wiring line contacts the second lead wiring line through a contact hole formed in the first inorganic insulating film in the surrounding region,
   the second lead wiring line overlaps the first bypass wiring line with the first inorganic insulating film interposed between the second lead wiring line and the first bypass wiring line in the surrounding region, the first bypass wiring line being adjacent to the first divided wiring line,
   the second lead wiring line contacts the first lead wiring line through a contact hole formed in the first inorganic insulating film in the surrounding region, and
   the first lead wiring line overlaps the second bypass wiring line with the first inorganic insulating film interposed between the first lead wiring line and the second bypass wiring line in the surrounding region.

2. The display device according to claim 1,
   wherein the second bypass wiring line is included in the plurality of upper layer power source lines.

3. The display device according to claim 1,
   wherein a frame region surrounding the display region includes two light emission control circuits facing each other in a direction parallel to the plurality of data signal lines via the display region, and two scanning signal line drive circuits facing each other in the direction parallel to the plurality of data signal lines via the display region,
   signals generated by the two scanning signal line driving circuits are input to both ends of each of the plurality of scanning signal lines, and
   signals generated by the two light emission control circuits are input to both ends of each of the plurality of light emission control lines not crossing the surrounding region and both ends of each of the plurality of light emission control lines divided.

4. The display device according to claim 1,
   wherein the first inorganic insulating film, an intermediate metal layer, a second inorganic insulating film, and the second metal layer are provided in this order,
   the display region is provided with a plurality of initialization power source lines and a plurality of lower layer power source lines extending parallel to the plurality of scanning signal lines and included in the intermediate metal layer,
   the plurality of lower layer power source lines are electrically connected to the plurality of upper layer power source lines through contact holes formed in the second inorganic insulating film,
   the intermediate metal layer includes a third bypass wiring line bypassing the through-hole in the surrounding region,
   the intermediate metal layer includes a third divided wiring line divided onto one side and the other side of the through-hole,
   the plurality of lower layer power source lines includes the third bypass wiring line, and
   the plurality of initialization power source lines includes the third divided wiring line.

5. The display device according to claim 4,
   wherein a third lead wiring line included in the intermediate metal layer and a fourth lead wiring line included in the second metal layer are provided,
   the third divided wiring line contacts the fourth lead wiring line through a contact hole formed in the second inorganic insulating film in the surrounding region,
   the fourth lead wiring line overlaps the third bypass wiring line with the second inorganic insulating film interposed between the fourth lead wiring line and the third bypass wiring line in the surrounding region, the third bypass wiring line being adjacent to the third divided wiring line,
   the fourth lead wiring line contacts the third lead wiring line through a contact hole formed in the second inorganic insulating film in the surrounding region, and
   the third lead wiring line overlaps the second bypass wiring line with the second inorganic insulating film interposed between the third lead wiring line and the second bypass wiring line, and overlaps the first bypass wiring line with the first inorganic insulating film interposed between the third lead wiring line and the first bypass wiring line in the surrounding region.

6. The display device according to claim 4,
   wherein the third divided wiring line overlaps the first bypass wiring line with the first inorganic insulating film interposed between the third divided wiring line and the first bypass wiring line, and overlaps the second bypass wiring line with a third area of overlap with the second inorganic insulating film interposed between the third divided wiring line and the second bypass wiring line in the surrounding region,
   the third divided wiring line overlaps the data signal line other than the second bypass wiring line or the upper layer power source line other than the second bypass wiring line with a fourth area of overlap with the second inorganic insulating film interposed between the third divided wiring line and the data signal line or the upper layer power source line in the display region, and the third area>the fourth area.

7. A display device comprising:
a substrate;
a first metal layer, a first inorganic insulating film, and a second metal layer in this order on the substrate;
a display region provided with a plurality of scanning signal lines and a plurality of light emission control lines included in the first metal layer, the plurality of light emission control lines extending parallel to the plurality of scanning signal lines, and provided with a plurality of data signal lines and a plurality of upper layer power source lines crossing the plurality of scanning signal lines and included in the second metal layer; and
a through-hole and a surrounding region surrounding the through-hole inside an edge of the display region, wherein
at least one of configurations, in one of the configurations, the first metal layer includes a first bypass wiring line bypassing the through-hole in the surrounding region and a first divided wiring line divided onto one side and the other side of the through-hole, and in the other of the configurations, the second metal layer includes a second bypass wiring line bypassing the through-hole in the surrounding region and a second divided wiring line divided onto one side and the other side of the through-hole,
the first bypass wiring line is included in the plurality of scanning signal lines, and the first divided wiring line is included in the plurality of light emission control lines,
the second bypass wiring line is included in the plurality of data signal lines,
the second bypass wiring line overlaps the first divided wiring line with the first inorganic insulating film interposed between the second bypass wiring line and the first divided wiring line in the surrounding region,
the first divided wiring line overlaps the second bypass wiring line with a first area of overlap with the first inorganic insulating film interposed between the first divided wiring line and the second bypass wiring line in the surrounding region,
the first divided wiring line overlaps the data signal line other than the second bypass wiring line or the upper layer power source line other than the second bypass wiring line with a second area of overlap with the first inorganic insulating film interposed between the first divided wiring line and the data signal line or the upper layer power source line in the display region, and
the first area>the second area.

8. The display device according to claim 7, wherein the second bypass wiring line is included in the plurality of upper layer power source lines.

9. The display device according to claim 7, wherein a frame region surrounding the display region includes two light emission control circuits facing each other in a direction parallel to the plurality of data signal lines via the display region, and two scanning signal line drive circuits facing each other in the direction parallel to the plurality of data signal lines via the display region,
signals generated by the two scanning signal line driving circuits are input to both ends of each of the plurality of scanning signal lines, and
signals generated by the two light emission control circuits are input to both ends of each of the plurality of light emission control lines not crossing the surrounding region and both ends of each of the plurality of light emission control lines divided.

10. The display device according to claim 7, wherein the first inorganic insulating film, an intermediate metal layer, a second inorganic insulating film, and the second metal layer are provided in this order,
the display region is provided with a plurality of initialization power source lines and a plurality of lower layer power source lines extending parallel to the plurality of scanning signal lines and included in the intermediate metal layer,
the plurality of lower layer power source lines are electrically connected to the plurality of upper layer power source lines through contact holes formed in the second inorganic insulating film,
the intermediate metal layer includes a third bypass wiring line bypassing the through-hole in the surrounding region,
the intermediate metal layer includes a third divided wiring line divided onto one side and the other side of the through-hole,
the plurality of lower layer power source lines includes the third bypass wiring line, and
the plurality of initialization power source lines includes the third divided wiring line.

11. The display device according to claim 10, wherein a third lead wiring line included in the intermediate metal layer and a fourth lead wiring line included in the second metal layer are provided,
the third divided wiring line contacts the fourth lead wiring line through a contact hole formed in the second inorganic insulating film in the surrounding region,
the fourth lead wiring line overlaps the third bypass wiring line with the second inorganic insulating film interposed between the fourth lead wiring line and the third bypass wiring line in the surrounding region, the third bypass wiring line being adjacent to the third divided wiring line,
the fourth lead wiring line contacts the third lead wiring line through a contact hole formed in the second inorganic insulating film in the surrounding region, and
the third lead wiring line overlaps the second bypass wiring line with the second inorganic insulating film interposed between the third lead wiring line and the second bypass wiring line, and overlaps the first bypass wiring line with the first inorganic insulating film interposed between the third lead wiring line and the first bypass wiring line in the surrounding region.

12. The display device according to claim 10, wherein the third divided wiring line overlaps the first bypass wiring line with the first inorganic insulating film interposed between the third divided wiring line and the first bypass wiring line, and overlaps the second bypass wiring line with a third area of overlap with the second inorganic insulating film interposed between the third divided wiring line and the second bypass wiring line in the surrounding region,
the third divided wiring line overlaps the data signal line other than the second bypass wiring line or the upper layer power source line other than the second bypass wiring line with a fourth area of overlap with the second inorganic insulating film interposed between the third divided wiring line and the data signal line or the upper layer power source line in the display region, and the third area>the fourth area.

13. A display device comprising:
a substrate;
a first metal layer, a first inorganic insulating film, and a second metal layer in this order on the substrate;
a display region provided with a plurality of scanning signal lines and a plurality of light emission control lines included in the first metal layer, the plurality of light emission control lines extending parallel to the plurality of scanning signal lines, and provided with a plurality of data signal lines and a plurality of upper layer power source lines crossing the plurality of scanning signal lines and included in the second metal layer; and
a through-hole and a surrounding region surrounding the through-hole inside an edge of the display region, wherein
at least one of configurations, in one of the configurations, the first metal layer includes a first bypass wiring line bypassing the through-hole in the surrounding region and a first divided wiring line divided onto one side and the other side of the through-hole, and in the other of the configurations, the second metal layer includes a second bypass wiring line bypassing the through-hole in the surrounding region and a second divided wiring line divided onto one side and the other side of the through-hole,
the second bypass wiring line is included in the plurality of data signal lines, and the second divided wiring line is included in the plurality of upper layer power source lines,
the first bypass wiring line is included in the plurality of scanning signal lines,
a fifth lead wiring line included in the first metal layer and a sixth lead wiring line included in the second metal layer are provided,
the second divided wiring line contacts the fifth lead wiring line through a contact hole formed in the first inorganic insulating film in the surrounding region,
the fifth lead wiring line overlaps the second bypass wiring line with the first inorganic insulating film interposed between the fifth lead wiring line and the second bypass wiring line in the surrounding region, the second bypass wiring line being adjacent to the second divided wiring line,
the fifth lead wiring line contacts the sixth lead wiring line through a contact hole formed in the first inorganic insulating film in the surrounding region, and
the sixth lead wiring line overlaps the first bypass wiring line with the first inorganic insulating film interposed between the sixth lead wiring line and the first bypass wiring line in the surrounding region.

14. The display device according to claim 13, wherein the first bypass wiring line is included in the plurality of light emission control lines.

15. The display device according to claim 13, wherein the first inorganic insulating film, an intermediate metal layer, a second inorganic insulating film, and the second metal layer are layered in this order,
the display region is provided with a plurality of initialization power source lines and a plurality of lower layer power source lines extending parallel to the plurality of scanning signal lines and included in the intermediate metal layer,
the plurality of lower layer power source lines are electrically connected to the plurality of upper layer power source lines through contact holes formed in the second inorganic insulating film,
the intermediate metal layer includes a third bypass wiring line bypassing the through-hole in the surrounding region,
the intermediate metal layer includes a third divided wiring line divided onto one side and the other side of the through-hole,
the plurality of lower layer power source lines includes the third bypass wiring line, and
the plurality of initialization power source lines includes the third divided wiring line.

16. The display device according to claim 15, wherein a third lead wiring line included in the intermediate metal layer and a fourth lead wiring line included in the second metal layer are provided,
the third divided wiring line contacts the fourth lead wiring line through a contact hole formed in the second inorganic insulating film in the surrounding region,
the fourth lead wiring line overlaps the third bypass wiring line with the first inorganic insulating film interposed between the fourth lead wiring line and the third bypass wiring line in the surrounding region, the third bypass wiring line being adjacent to the third divided wiring line,
the fourth lead wiring line contacts the third lead wiring line through a contact hole formed in the second inorganic insulating film in the surrounding region, and
the third lead wiring line overlaps the second bypass wiring line with the second inorganic insulating film interposed between the third lead wiring line and the second bypass wiring line, and overlaps the first bypass wiring line with the first inorganic insulating film interposed between the third lead wiring line and the first bypass wiring line in the surrounding region.

17. The display device according to claim 15, wherein the third divided wiring line overlaps the first bypass wiring line with the first inorganic insulating film interposed between the third divided wiring line and the first bypass wiring line, and overlaps the second bypass wiring line with a third area of overlap with the second inorganic insulating film interposed between the third divided wiring line and the second bypass wiring line in the surrounding region,
the third divided wiring line overlaps the data signal line other than the second bypass wiring line with a fourth area of overlap with the second inorganic insulating film interposed between the third divided wiring line and the data signal line or in the display region, and,
the third area>the fourth area.

* * * * *